(12) United States Patent
Quiquempoix

(10) Patent No.: US 9,584,153 B2
(45) Date of Patent: Feb. 28, 2017

(54) EFFICIENT DITHERING TECHNIQUE FOR SIGMA-DELTA ANALOG-TO-DIGITAL CONVERTERS

(71) Applicant: Microchip Technology Incorporated, Chandler, AZ (US)

(72) Inventor: Vincent Quiquempoix, Divonne les bains (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/594,388

(22) Filed: Jan. 12, 2015

(65) Prior Publication Data

US 2016/0204794 A1    Jul. 14, 2016

(51) Int. Cl.
| | |
|---|---|
| *H03M 1/20* | (2006.01) |
| *H03M 3/00* | (2006.01) |
| *H03M 1/06* | (2006.01) |
| *H03M 1/66* | (2006.01) |
| *H03M 1/36* | (2006.01) |

(52) U.S. Cl.
CPC ........... *H03M 3/33* (2013.01); *H03M 1/0641* (2013.01); *H03M 1/66* (2013.01); *H03M 1/361* (2013.01); *H03M 3/424* (2013.01)

(58) Field of Classification Search
CPC ........ H03M 3/33; H03M 1/0641; H03M 1/66; H03M 3/35; H03M 3/39
USPC .......................... 341/143, 155, 131
See application file for complete search history.

(56) References Cited

U.S. PATENT DOCUMENTS

| | | | |
|---|---|---|---|
| 6,304,608 B1 * | 10/2001 | Chen ....................... | H03M 3/35 341/143 |
| 7,961,126 B2 | 6/2011 | Deval et al. .................. | 341/131 |
| 2006/0187105 A1 | 8/2006 | Sakata et al. ................. | 341/155 |
| 2007/0222656 A1 * | 9/2007 | Melanson .............. | H03M 3/39 341/155 |

OTHER PUBLICATIONS

International Search Report and Written Opinion, Application No. PCT/US2016/013040, 14 pages, Apr. 13, 2015.

* cited by examiner

*Primary Examiner* — Jean B Jeanglaude
(74) *Attorney, Agent, or Firm* — Slayden Grubert Beard PLLC

(57) ABSTRACT

A sigma-delta analog to digital converter (ADC) includes an M-bit digital-to-analog converter (DAC); a loop filter coupled to receive an output from DAC; and a variable level quantizer configured to provide a uniform quantization function by switching between an N-level quantizer function and an N−1 level quantizer function.

13 Claims, 7 Drawing Sheets

EFFICIENT DITHERING TECHNIQUE FOR SIGMA-DELTA ANALOG-TO-DIGITAL CONVERTERS

TECHNICAL FIELD

The present disclosure relates to analog-to-digital converters (ADCs) and, more particularly, to a sigma-delta ADC with a multi-bit (M-bit, M>1) variable resolution quantizer having automatic dynamic dithering for removing undesired idle tones in the digital output of the sigma-delta ADC.

BACKGROUND

Analog-to-digital converters (ADCs) are in widespread use today in electronic applications for consumer, medical, industrial, etc. Typically, ADCs include circuitry for receiving an analog input signal and outputting a digital value proportional to the analog input signal. This digital value is typically in the form of either a parallel word or a serial digital bit stream. There are many types of analog-to-digital conversion schemes, such as voltage-to-frequency conversion, charge redistribution, delta modulation, as well as others. Typically, each of these conversion schemes has its advantages and disadvantages.

One type of analog-to-digital converter (ADC) that has seen increasing use is the sigma-delta ADC (sigma-delta and delta-sigma will be used interchangeably herein). A sigma-delta modulator typically converts an analog input to a digital serial string of "ones" and "zeros" having an average amplitude over time proportional to the analog input. Sigma-delta modulation generally provides for high accuracy and wide dynamic range as compared to earlier delta modulation techniques. Sigma-delta modulation is often referred to as an oversampled converter architecture and is typically immune from some of the earlier undesirable second order effects of delta modulation.

Each sigma-delta modulator loop includes one or more quantizers that convert the analog incoming signals to a digital output code. For a sigma-delta ADC, these quantizers are low-resolution ADCs, often 1-bit ADC (or comparators). In this case, the sigma-delta modulator is called a 1-bit modulator. If the output of the quantizer has a higher resolution than 1 bit, then the sigma-delta modulator is called a multi-bit modulator and the sigma-delta ADC is called a multi-bit sigma-delta ADC.

In a multi-bit sigma-delta ADC, the output resolution allows more than two digital output levels. If the number of possible output levels (nlev) is a power of 2 (for example nlev=2^M), the output can be encoded into an M-bit word and the modulator is a multi-bit M-bit modulator. However, the number of output levels (nlev) is not necessarily a power of 2 (especially for the low number of levels) and in this case, the modulator can also be called multi-bit or multi-level. For example, 3-level modulators are very popular. If nlev is a power of 2, an equivalent number of bits can be calculated for a multi-level modulator and is given by the formula: $M=\log_2(nlev)$ where M is the number of equivalent bits. If nlev is not a power of 2, the minimum number of bits required to encode the output is: $M=Floor(\log_2(nlev))$.

In a multi-level (or multi-bit) sigma-delta ADC, the quantizer is very often a differential input Flash ADC, composed of nlev−1 comparators in parallel with equidistant thresholds of comparison, placed at (nlev−2k)/(nlev−1) *Vref where k is an integer between 1 and (nlev−1), giving an output on nlev bits coded with a thermometer coding. In that case, the number of distinct output levels is nlev which can be coded into a minimum of Floor(log 2(nlev)) bits. For example, a 3-level modulator quantizer can be a Flash ADC composed of two (2) comparators with thresholds of +Vref/2 and −Vref/2 and the 3-level output words can be encoded into $Floor(\log_2(3))=2$ bits. The placement of the thresholds ensures also a uniform quantization which minimizes the quantization error average on the whole input range. In a typical flash ADC implementation, each comparator has its own switched-capacitor input stage in determining its associated voltage threshold, and a thermometer-to-binary encoder at the outputs of the flash comparators for generating the digital words to the sigma-delta modulator loop digital-to-analog converter (DAC), and a digital signal output decimation filter.

All sigma-delta modulators, working in a continuous mode, produce idle tones at their outputs if a certain periodic or direct current (DC) input is provided. These idle tones are due to the quantization process and are inherent in the design of the sigma-delta modulator architecture. In particular, these idle tones depend strongly on the amplitude and frequency of the input signal and are difficult to filter out since they can reside in the base band of the signal to be measured.

These idle tones are unwanted and create undesired behavior at the outputs like undesired high tones in an audio device. These tones limit the spurious free dynamic range (SFDR) and thus the signal-to-noise-and-distortion (SINAD) of the device especially if specific direct current (DC) inputs are provided (that are usually a rational fraction of the quantization step).

Commonly-assigned U.S. Pat. No. 7,961,126, which is hereby incorporated by reference in its entirety as if fully set forth herein, describes an approach using a variable resolution quantizer having automatic dithering for removing undesired idle tones in the digital output of a sigma-delta ADC. In that approach, a multi-bit quantizer changes its output resolution (its number of output levels) at each sample based on a random or pseudo-random resolution sequence. Changing the resolution modifies the quantization function, effectively adding a dither signal at the input of the quantizer. While generally effective, if the resolution sequence takes on resolution values that are too low, the resulting quantization noise may be relatively high.

SUMMARY

According to an embodiment, systems and methods are provided for reducing quantization noise and reducing idle tones.

A sigma-delta analog to digital converter (ADC) according to embodiments includes an M-bit digital-to-analog converter (DAC); a loop filter coupled to receive an output from DAC; and a variable level quantizer configured to provide an average uniform quantization function by switching between an N-level quantizer function and an N−1 level quantizer function. In some embodiments, an occurrence of the N-level quantizer function is equally probable to an occurrence of the N−1 level quantizer function. In some embodiments, a quantization function of the N-level quantizer is multiplied by (N−1)/(N−2). In some embodiments, the possible DAC inputs are multiplied by (N−1)/(N−2). In some embodiments, a post-processing decimation filter can process digital inputs multiplied by (N−1)/(N−2).

A method for reducing idle tones in a sigma-delta analog-to-digital converter, according to embodiments include generating a random sequence for a quantization function; and using the random sequence for switching between an N-level quantizer function and an N−1 level quantizer function. In some embodiments, an occurrence of the N-level quantizer function is equally probable to an occurrence of the N−1 level quantizer function. In some embodiments, the quantization function of the N-level quantizer is multiplied by (N−1)/(N−2). In some embodiments, associated possible digital to analog converter inputs are multiplied by (N−1)/(N−2) when the N−1 levels resolution is chosen by the variable resolution sequence. In some embodiments, a post-processing decimation filter can process digital inputs multiplied by (N−1)/(N−2).

A system according to embodiments includes a multi-level digital-to-analog converter; a variable resolution quantizer; a random sequence generator coupled to the variable resolution quantizer and configured to generate a random sequence for determining resolution of the variable resolution quantizer; wherein an average uniform quantization function is provided by switching between an N-level quantizer function and an N−1 level quantizer function. In some embodiments, an occurrence of the N-level quantizer function is equally probable to an occurrence of the N−1 level quantizer function. In some embodiments, the quantization function of the N-level quantizer is multiplied by (N−1)/(N−2). In some embodiments, the possible DAC inputs are multiplied by (N−1)/(N−2) when the N−1 levels resolution is chosen by the variable resolution sequence. In some embodiments, a post-processing decimation filter can process digital inputs multiplied by (N−1)/(N−2).

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 1:
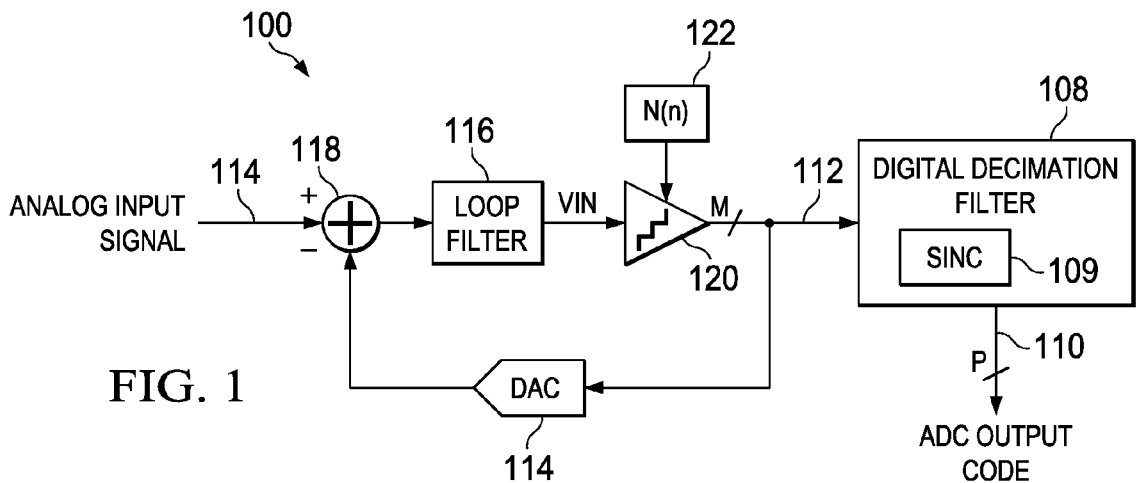
FIG. 1 is a diagram illustrating an exemplary sigma-delta multi-bit modulator having a variable resolution quantizer.

Referring to FIG. 1, depicted is a schematic block diagram of a single-loop sigma-delta multi-bit (M-bit, M>1) modulator having a variable resolution quantizer coupled to a random sequence generator that dithers the signal incoming from the loop filter or the modulator, according to a specific example embodiment of this disclosure. Generally represented by the numeral 100, a multi-level (nlev) sigma-delta ADC with variable resolution quantizer comprises an input voltage summation node 118, a loop filter 116, a variable resolution multi-bit quantizer 120, a multi-bit digital-to-analog converter (DAC) 114, a random sequence generator 122 having a resolution sequence N(n), and a digital decimation filter 108. A single feedback loop is shown in FIG. 1, however, multi-loop (cascaded, MASH, etc.) with multiple variable resolution quantizers may be used. The output bitstream 112 has N(n) distinct levels and may be encoded into M-bits where M=Floor($\log_2$(nlev)) and M>1. The number of levels of the variable resolution multi-bit quantizer 120 may change for each sample n, where N(n) comprises integer values between 2 and nlev.

The random sequence generator 122 generates random or pseudo-random number sequences, N(n). At each voltage sample n taken by the sigma-delta ADC 100, a random integer number between 2 and nlev is output from the random sequence generator 122. The random number sequence N(n) generated by the random sequence generator 122 is hereinafter called a "resolution sequence." The random sequence generator 120 may be, for example but is not limited to, a Galois linear feedback shift register (LFSR), digital comparators and an adder. The random sequence generator 122 introduces dithering by controlling the resolution level of the variable resolution multi-bit quantizer 120.

Figure 2:
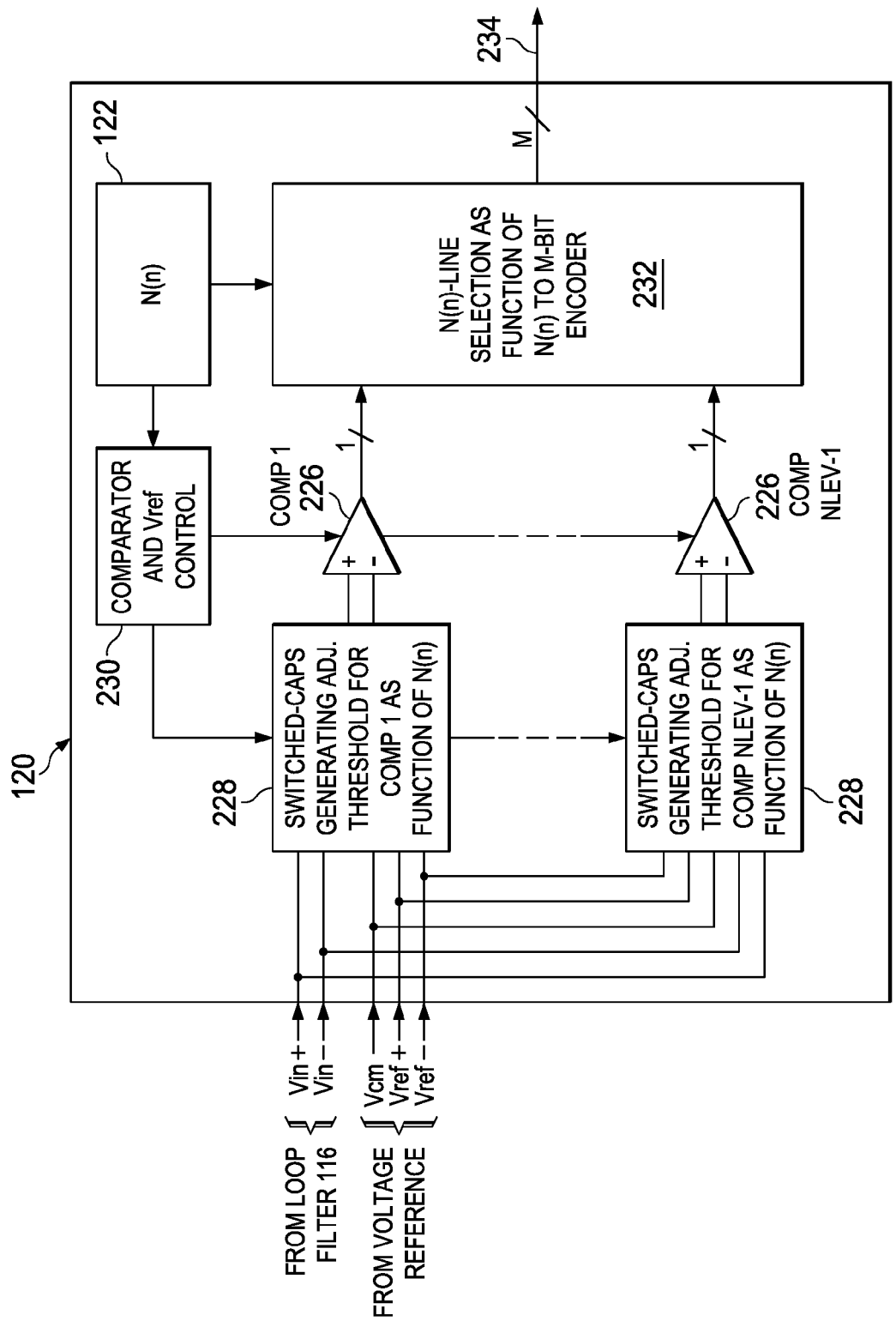
FIG. 2 is a diagram illustrating an exemplary sigma-delta modulator having a flash ADC architecture, where each comparator of the flash ADC has switched-capacitor blocks for generating the required threshold of each comparator.

Referring now to FIG. 2, depicted is a more detailed schematic block diagram of a variable resolution multi-level quantizer that is based on a flash analog-to-digital converter (ADC) architecture coupled to a random or pseudo-random sequence generator, where each comparator of the flash ADC has switched-capacitor blocks for generating various reference thresholds selected by the random or pseudo-random sequence generator as used with the sigma-delta M-bit (M>1) modulator, according to the specific example embodiment shown in FIG. 2. The variable resolution multi-bit quantizer 220 comprises a plurality of voltage comparators 226, each having a switched-capacitor block 228, a comparator and reference voltage controller 230, the random sequence generator 122 having a resolution sequence N(n), and an N(n)-line to M-bit encoder (e.g., thermometer encoder).

Each of the switched capacitor blocks 228 is adapted to receive voltage samples Vin from the loop filter 116 and generate adjustable threshold reference voltage values (e.g., voltage levels) based upon the switched capacitor ratios determined by the resolution sequence N(n) value generated by the random sequence generator 122.

A voltage reference (not shown) is also coupled to the switched capacitor blocks 228 whose selectable switched capacitor ratios create the adjustable reference voltage values from this voltage reference Vref=Vref+−Vref− and use the adjustable reference voltage values with respective ones of the plurality of voltage comparators 226. When a different reference voltage value is required for a particular voltage comparator 226, it is a simple matter to just switch in different ratios of capacitance to achieve the desired reference voltage value based upon the resolution sequence N(n). One having ordinary skill in the art of electronic circuits and having the benefit of this disclosure would readily understand how to implement such a variable capacitance ratio switching arrangement used with comparators in a switched capacitor input flash ADC 100.

The plurality of comparators 226 are coupled through the switched-capacitor blocks 228 to differential inputs Vin+ and Vin− that are coupled to the loop filter 116 and thereby receive the sampled voltage Vin=Vin+−Vin−.

The nlev−1 switched-capacitor blocks 228 generate threshold voltages for the nlev−1 comparators 226 that operate in parallel to produce a thermometer encoding of Vin. The threshold voltages are generated specifically for the number of N(n)−1 comparators 226 used in doing the flash conversion. The number of N(n)−1 comparators 226 used are based upon the resolution sequence N(n) value for each input voltage Vin sample taken. For a uniform quantization of the input voltage samples Vin, the threshold voltages may be determined as follows: threshold(k,n)=((N(n)−2k)/(N(n)−1))*Vref.

Selected outputs from the plurality of comparators 226 are applied to the N(n)-line to M-bit encoder 232 for generating an M-bit word for each voltage sample, Vin(n), resulting in a multi-bit bit stream output 234 therefrom. Only N(n)−1 outputs from the comparators 626 are used to generate the M-bit word for each input voltage sample n, and the M-bit word thereby has only N(n) distinct values, e.g., output levels.

According to an embodiment, idle tones may be removed by only using N and N−1 levels in the resolution sequence, where N is an integer >2. Further, to minimize the idle tones, the quantization function should be on average a uniform quantization function. In this case, a uniform quantization would give, for an N-level quantizer, thresholds equally spaced at $$\text{Thr}(k,N)=+/-Vref*(2k+1)/(N-1) \text{ if } N \text{ is odd and}$$

$$\text{Thr}(k,N)=+/-Vref*(2k)/(N-1) \text{ if } N \text{ is even.}$$

Figure 3A:
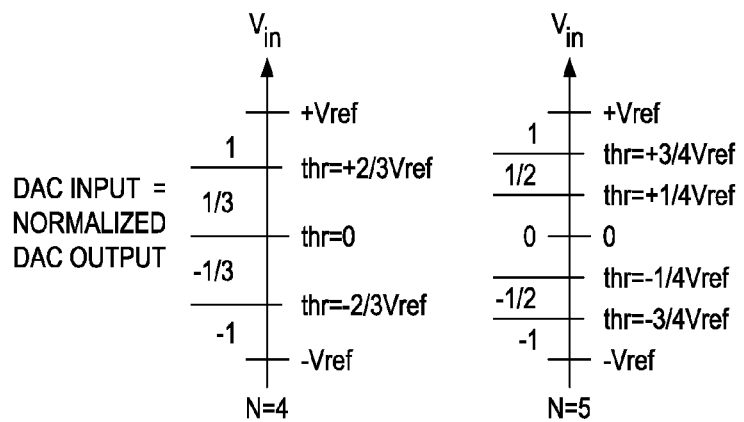
FIG. 3A illustrates quantization thresholds for a sigma-delta modulator.
Figure 3B:
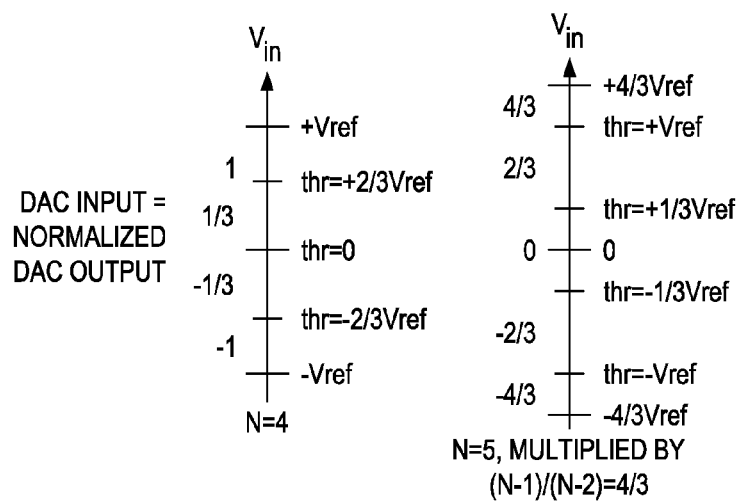
FIG. 3B illustrates quantization thresholds for a sigma-delta modulator.
Figure 4A:
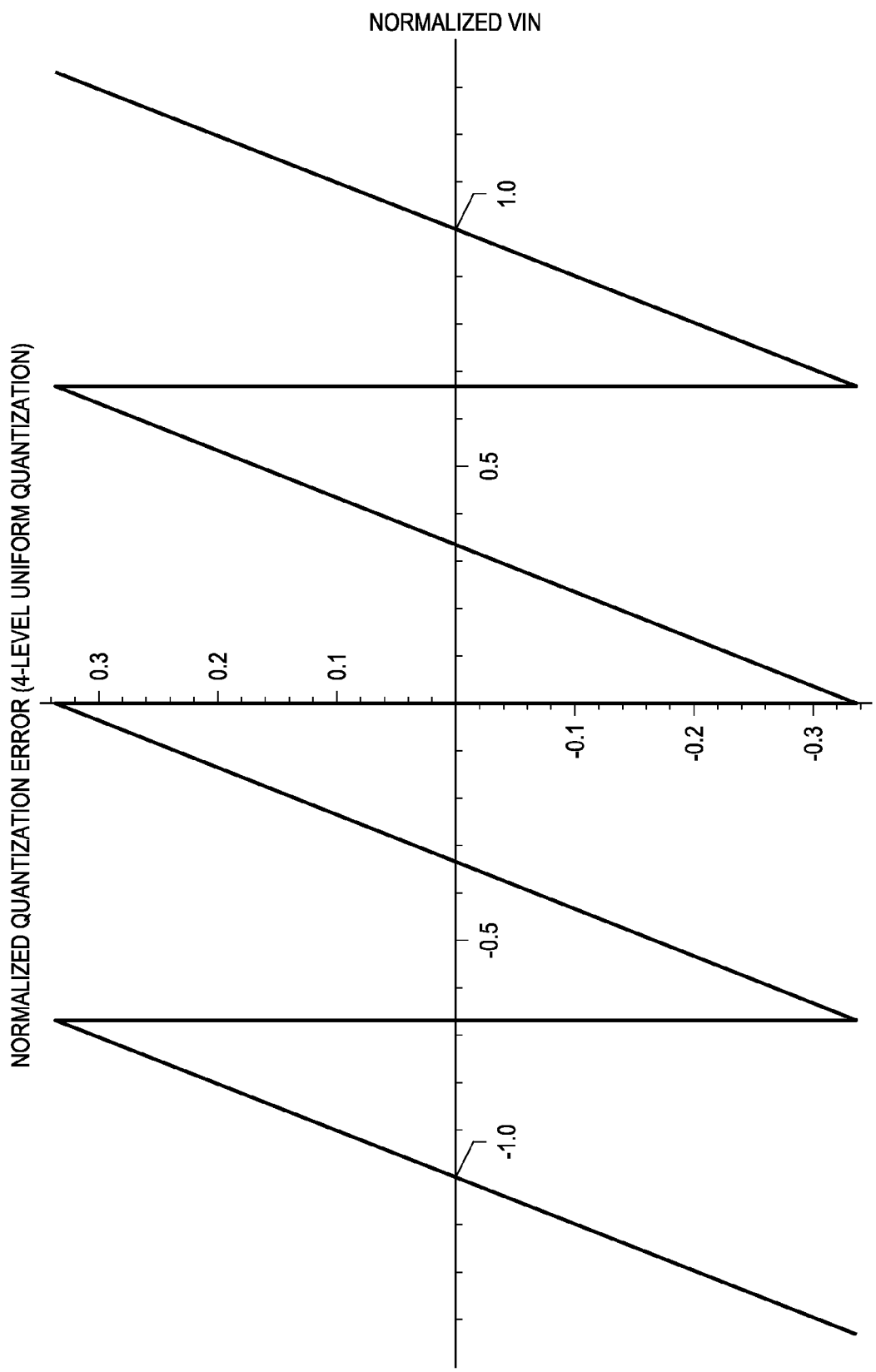
FIG. 4A and FIG. 4B illustrate quantization error for 4 and 5 level uniform quantization, respectively.
Figure 4B:
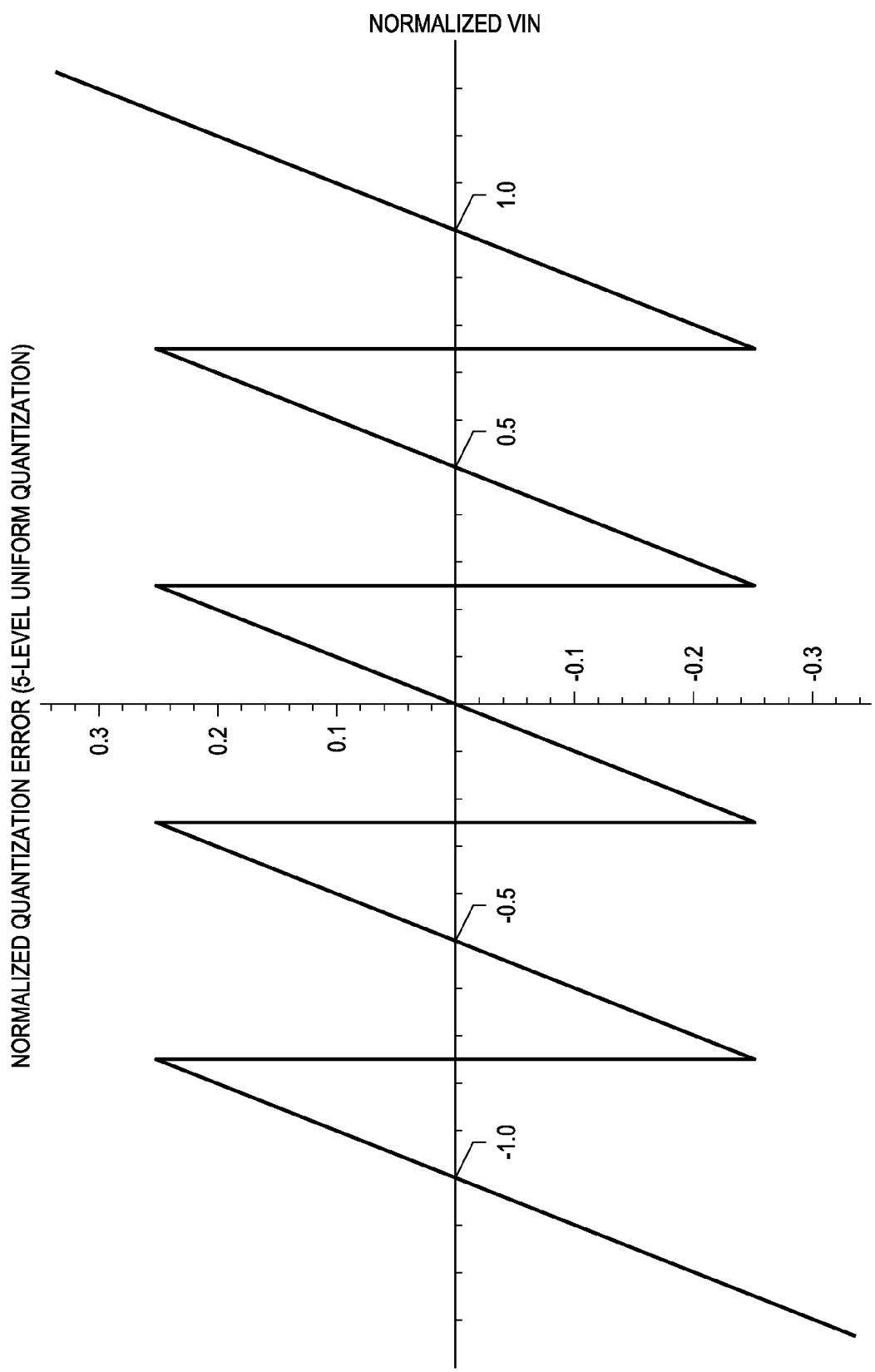

As shown in FIG. 3, the difference between each threshold is different for the uniform quantization with N and N−1 levels. The difference between adjacent levels is Vref/(N−1) for N levels and Vref/(N−2) for N−1 levels. For the case where N=4, the quantization error with a uniform quantization function is shown in FIG. 4A. For the case where N=5 the quantization error with a uniform quantization function is shown in FIG. 4B.

If the resolution sequence takes an average of N−1 and N levels in the quantizer for an equal amount of samples, the resulting quantization error for a constant Vin at the quantizer input is, on average, the average of the quantization errors for N and N−1 levels.

Figure 5:
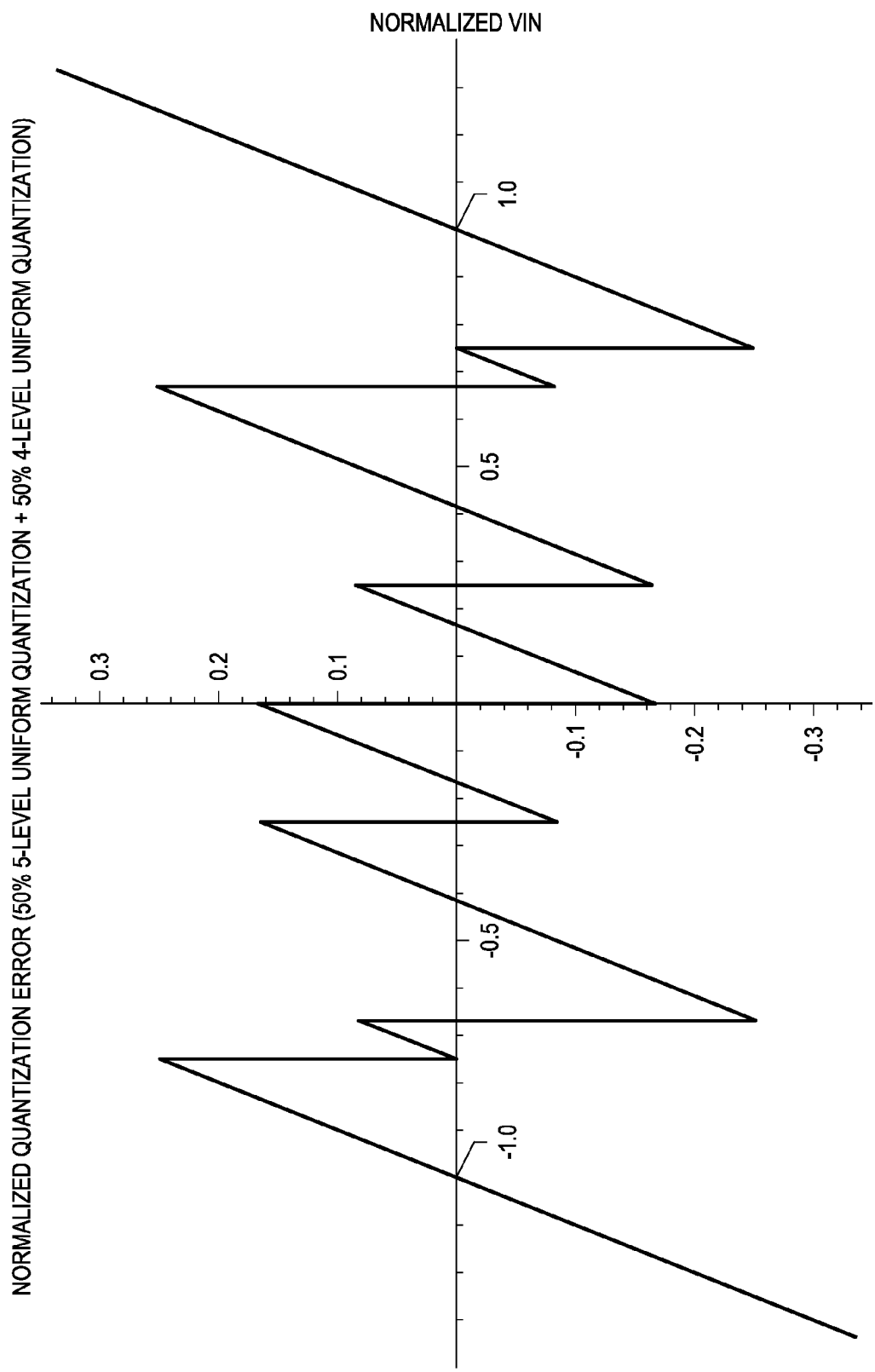
FIG. 5 illustrates quantization error for 50% 5 level and 50% 4 level quantization.

However, as it is shown in FIG. 5 (quantization error 4 level+5 level), the resulting simple average of N and N−1 levels quantizations is not a uniform quantization. The quantization error is not well distributed throughout the full Vin range which would lead to degraded SNR results.

For N−1 levels, the uniform quantization gives:

$$\text{Thr}(k,N-1)=+/-Vref*2k/(N-2) \text{ if } N \text{ is odd}$$

$$\text{Thr}(k,N-1)=+/-Vref*(2k+1)/(N-2) \text{ if } N \text{ is even}$$

A uniform quantization on average may be obtained, however, if within the occurrence of the N level quantizer, the quantization function of the N-level quantizer is multiplied by (N−1)/(N−2). The multiplication of the quantization function implies here two elements: the multiplication of the thresholds by (N−1)/(N−2) and the multiplication of the possible output values of the N-level quantizer by (N−1)/(N−2). These quantizer outputs being also the DAC inputs in the sigma-delta modulator loop, the DAC has to be modified to accept levels at its inputs that are multiplied by (N−1)/(N−2).

That is, if instead of a simple average between the quantization errors of N and N−1 levels quantizers, an average is performed between the quantization error of a uniform N−1 level quantizer and a uniform N level quantizer but with a scaling of (N−1)/(N−2) for the possible outputs and thresholds of the quantizer, then the resulting average quantization function is then uniform and leads to lower quantization error and therefore improved SNR results as shown in FIG. 5. It can be shown mathematically that this is the only solution for a simple threshold scaling to obtain a uniform average quantization function. In this case, the variable resolution also has to be equally distributed between the N levels and N−1 levels resolutions to make the average effective and to lead to a uniform quantization function in average.

The resulting average uniform quantization does not necessarily improve SNR for any given signal but if the signal is not known, this optimized sequence has a larger chance to optimize the quantization noise if the Vin distribution is considered uniform which is why it is a more preferred choice. The resulting SNR may be degraded for very specific signals that are correlated with the pseudo-random or random sequence determining the resolution sequence, but when this correlation is weak, the resulting SNR will be improved compared to any other scaling and compared to a fixed N−1 level quantizer implementation. This new quantization function has the largest chance to optimize the quantization error for any given signal when a variable resolution equally distributed between N and N−1 levels is implemented.

In some embodiments, the scaling may be accomplished simply by a direct multiplication of the quantization function of the N-level DAC (i.e., a multiplication of the thresholds value and the possible outputs of the quantizer by the same factor). An exemplary N-level DAC is shown in commonly-assigned U.S. Pat. No. 7,102,558, which is hereby incorporated by reference in its entirety as if fully set forth herein. It is noted, however, that other N-level DACs may be used. That is, the thresholds become:

$$\text{Thr}(k)=+/-Vref*(2k+1)/(N-2) \text{ if } N \text{ is odd and}$$

Thr($k$)=+/−Vref*($2k$)/($N$−2) if $N$ is even

Figure 6:
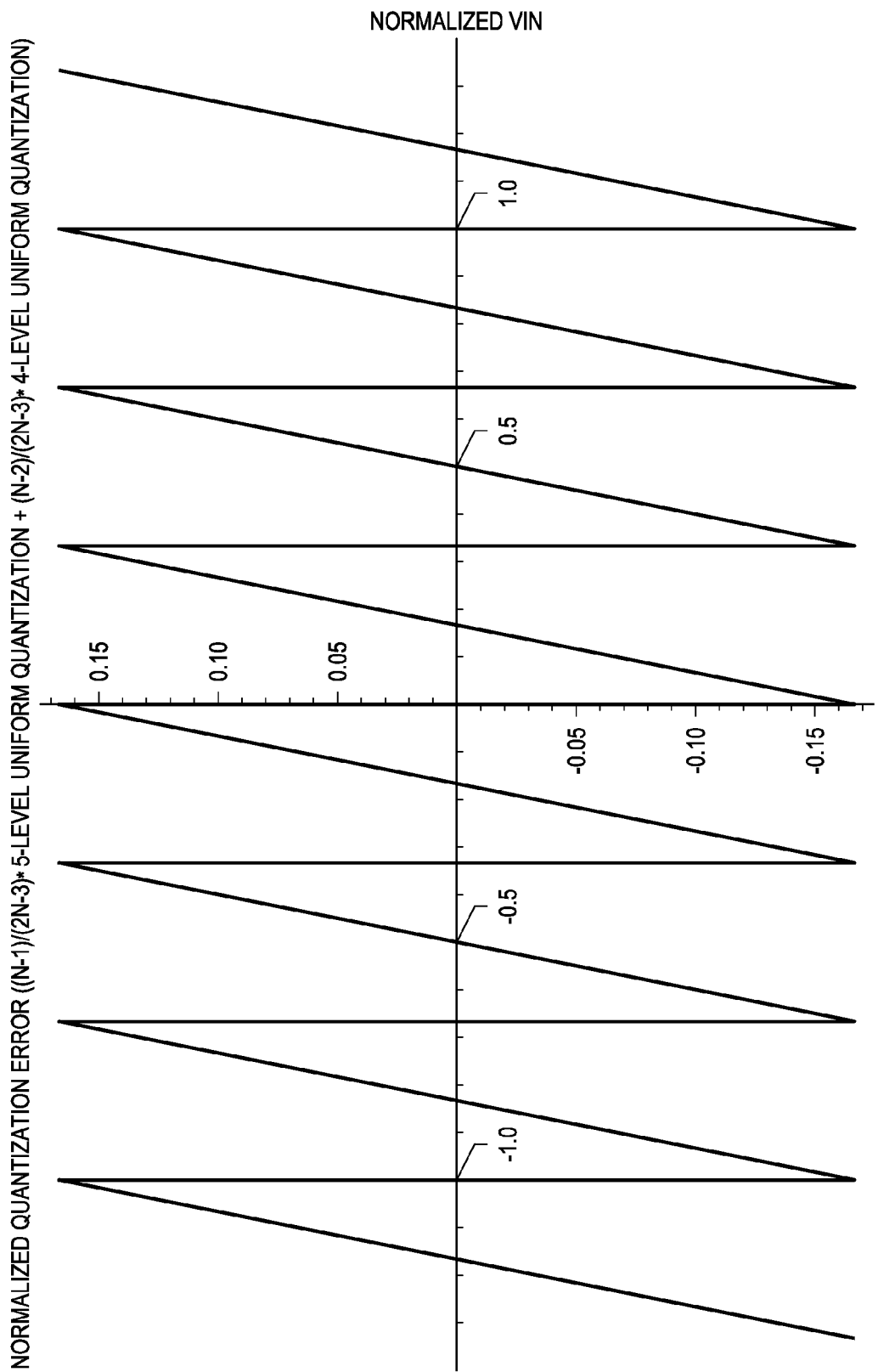
FIG. 6 illustrates quantization error showing dithered quantization.

In this case, the N level quantization function is multiplied by (N−1)/(N−2). Here, the thresholds for the N level quantizer will align in the middle of the previous quantization steps (of the N−1 level quantizer), as shown in FIG. 6.

The N-level threshold cuts exactly in half the N−1 quantizer steps here, which is important in obtaining a resulting average uniform quantization. In addition, the quantized input range is now +/−Vref*(N−1)/(N−2), so it is larger by the same scaling factor of (N−1)/(N−2).

To be consistent with this scaling factor, the possible inputs to the DAC 114 may be multiplied by (N−1)/(N−2) to keep the right scaling, and therefore the possible DAC outputs may also multiplied by (N−1)/(N−2) to be able to keep the gain of 1 between inputs and outputs. This is shown in FIG. 6 where the inputs of the DAC are now 4/3, 2/3, 0, −2/3, and −4/3 for a 5 level DAC instead of 1, ½, 0, −½, −1 in the standard case of FIG. 3. The multiplication of the N-level possible DAC outputs may degrade or disturb the stability of the sigma-delta modulator loop since the (N−1)/(N−2) factor is superior to 1 and therefore can create overrange situations. The coefficients of the sigma-delta loop at each DAC output branch may be down-scaled by multiplying them by (N−2)/(N−1) to be able recover form the potential overrange situations and recover the previous stability of the loop. In order to perform this scaling factor necessary to reach the average uniform quantization, the DAC itself may be configured to provide a N-Level DAC with a scaling factor of (N−1)/(N−2), which may not be trivial as it requires an overrange capability since (N−1)/(N−2)>1.

This modification of an N-level DAC can be done simply by amplifying the Vref input of the DAC and the Vref input of the circuits generating the threshold of the quantizers (circuit 228 in FIG. 2) when the N-level quantizer is selected in the resolution sequence.

As long as the output code of the quantizer is normalized to Vref so that when the scaling is done, the output is multiplied by (N−1)/(N−2), synchronously with the Vref amplification by a factor of (N−1)/(N−2), the DAC circuitry itself does not have to be modified.

Some other implementation may not directly amplify Vref, but in the case of a charge transfer DAC, sample Vref on a capacitor and amplify the charge associated by sampling on a (N−1)/(N−2) times larger capacitor when the N-level is selected to emulate a Vref amplification of the same factor, without modifying the Vref voltage generation.

Minor modification to an existing N−1 level DAC may give the desired outputs. Starting with a N−1-level DAC, there can be minor modifications to the existing design to obtain the N-level DAC with the desired (N−1)/(N−2) scaled thresholds and outputs. This is based on the following observation: the thresholds for a scaled N-level DAC by (N−1)/(N−2) are thr($k$)=+/−Vref*($2k$+1)/(N−2) if N is odd and thr($k$)=+/−Vref*($2k$)/(N−2) if N is even.

So turning a N−1 level DAC into a scaled version of a N-level DAC with a scaling of (N−1)/(N−2) can be realized by adding +/−1/(N−2)*Vref to each existing threshold and get an additional threshold at +/−(N−1)/(N−2)*Vref. These modifications can be minor in the case of a charge-transfer based DAC.

Figure 7:
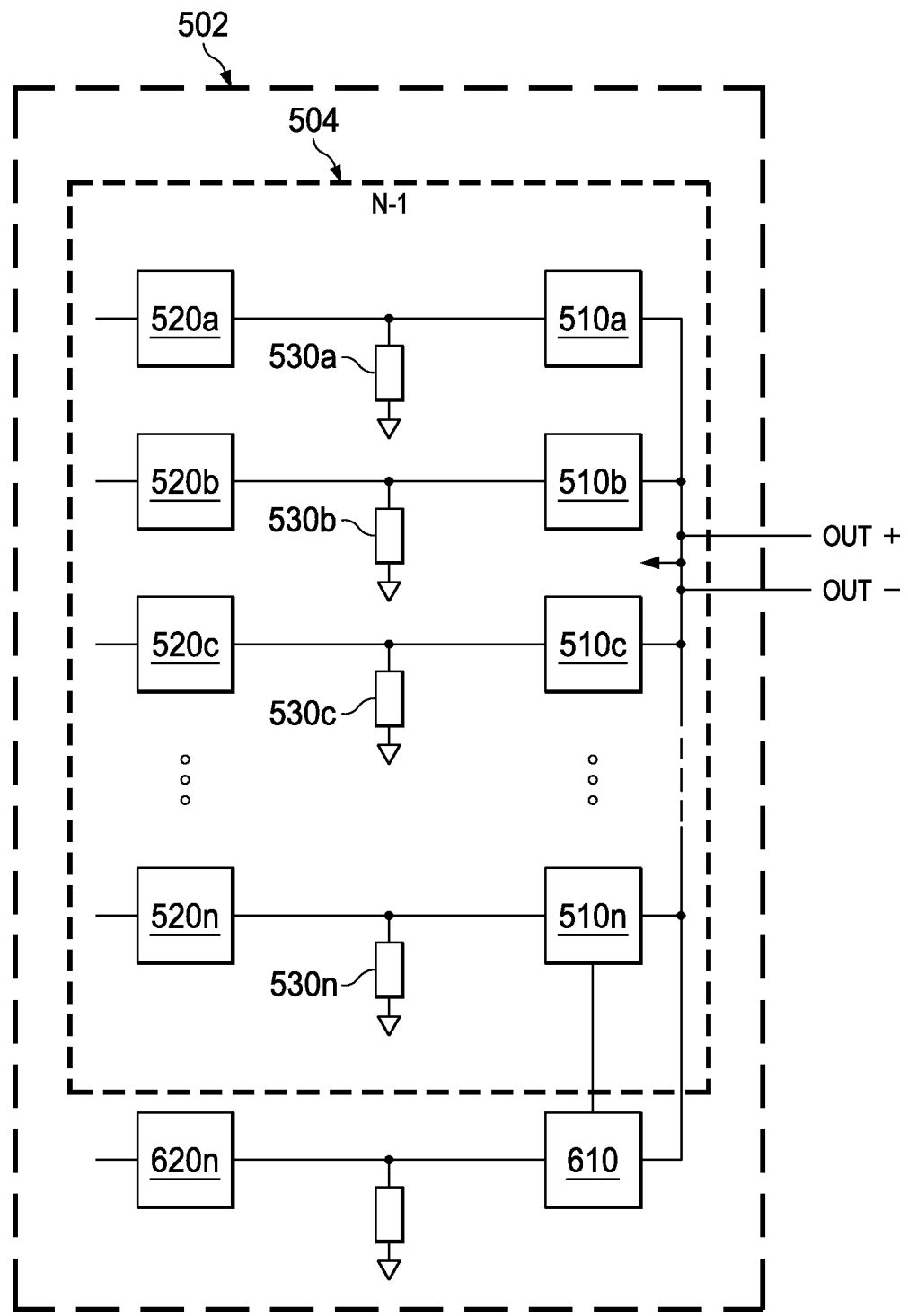
FIG. 7 is a diagram schematically illustrating switch-capacitor blocks for threshold comparison.

Turning now to FIG. 7, an exemplary switched capacitor block switching configuration for an N-level DAC that can provide modified outputs multiplied by (N−1)/(N−2) is shown.

Broadly speaking, the arrangement 502 includes an arrangement for an N−1 level charge transfer DAC with Cref capacitors 510*a* . . . 510*n*, and associated witches 520*a*-520*n* and 520*a*-530*n*. In an arrangement for an N−1 level DAC, the Cref caps comprise N−2 unit caps and their appropriate set of switches to give proper DAC outputs. Each Cref cap 510*a*-510*n* gives a 1/(N−2) Cref*Vref times increment to the DAC output.

According to embodiments, in order to build a N-level DAC out of this N−1 level standard DAC, with embedded (N−1)/(N−2) scaling, an additional Cref capacitor 610 (and associated switches 620*n*, 630*n*) can be provided in parallel. This additional capacitor will add when charged +/−1/(N−2)Cref*Vref to the outputs to give the right values for the new desired thresholds. For example, for N=6, a fifth unit cap can be added in parallel so that the DAC outputs have 0.25Vref added for the positive side and −0.25Cref*Vref for the negative side to give the desired output values: 1.25Cref*Vref/−0.75Cref*Vref/−0.25 Cref*Vref/ 0.25Cref*Vref/0.75Cref*Vref/1.25Cref*Vref.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A sigma-delta analog to digital converter (ADC) comprising:
   an M-bit digital-to-analog converter (DAC);
   a loop filter coupled to receive an output from DAC; and
   a variable level quantizer to provide an average uniform quantization function by switching between an N-level quantizer function and an N−1 level quantizer function.

2. The sigma-delta ADC of claim 1, wherein an occurrence of the N-level quantizer function is equally probable to an occurrence of the N−1 level quantizer function.

3. The sigma-delta ADC of claim 2, wherein a quantization function of the N-level quantizer is multiplied by (N−1)/(N−2).

4. The sigma-delta ADC of claim 1, wherein the possible DAC inputs are multiplied by (N−1)/(N−2).

5. The sigma-delta ADC of claim 1, wherein a post-processing decimation filter can process digital inputs multiplied by (N−1)/(N−2).

6. A method for reducing idle tones in a sigma-delta analog-to-digital converter, comprising:
   generating a random sequence for a quantization function; and
   using the random sequence for switching between an N-level quantizer function and an N−1 level quantizer function, wherein:
   the quantization function of the N-level quantizer is multiplied by (N−1)/(N−2); and
   associated possible digital to analog converter inputs are multiplied by (N−1)/(N−2) when the N−1 levels resolution is chosen by the variable resolution sequence.

7. The method of claim 6, wherein a post-processing decimation filter can process digital inputs multiplied by (N−1)/(N−2).

8. The method of claim 6, wherein an occurrence of the N-level quantizer function is equally probable to an occurrence of the N−1 level quantizer function.

9. A system, comprising:
   a multi-level digital-to-analog converter;
   a variable resolution quantizer;
   a random sequence generator coupled to the variable resolution quantizer to generate a random sequence for determining resolution of the variable resolution quantizer;
   wherein an average uniform quantization function is provided by switching between an N-level quantizer function and an N−1 level quantizer function.

10. The system of claim 9, wherein an occurrence of the N-level quantizer function is equally probable to an occurrence of the N−1 level quantizer function.

11. The system of claim 9, wherein the quantization function of the N-level quantizer is multiplied by (N−1)/(N−2).

12. The system of claim 11, wherein the possible DAC inputs are multiplied by (N−1)/(N−2) when the N−1 levels resolution is chosen by the variable resolution sequence.

13. The system of claim 11, wherein a post-processing decimation filter can process digital inputs multiplied by (N−1)/(N−2).

* * * * *